United States Patent
Yamada

(10) Patent No.: US 10,848,128 B2
(45) Date of Patent: Nov. 24, 2020

(54) BAND ELIMINATION FILTER AND COMPOSITE FILTER

(71) Applicant: Murata Manufacturing Co., Ltd., Nagaokakyo (JP)

(72) Inventor: Takayuki Yamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 50 days.

(21) Appl. No.: 16/114,522

(22) Filed: Aug. 28, 2018

(65) Prior Publication Data

US 2018/0367121 A1    Dec. 20, 2018

Related U.S. Application Data

(63) Continuation of application No. PCT/JP2016/085989, filed on Dec. 2, 2016.

(30) Foreign Application Priority Data

Feb. 29, 2016 (JP) .................................. 2016-038458

(51) Int. Cl.
*H03H 9/64* (2006.01)
*H03H 9/145* (2006.01)
(Continued)

(52) U.S. Cl.
CPC ....... *H03H 9/6483* (2013.01); *H01P 1/20336* (2013.01); *H03H 9/02834* (2013.01);
(Continued)

(58) Field of Classification Search
CPC .......... H03H 9/02574; H03H 9/02834; H03H 9/14576; H03H 9/14582; H03H 9/205;
(Continued)

(56) References Cited

U.S. PATENT DOCUMENTS 6,420,946 B1 *  7/2002  Bauer ................ H03H 9/14547
                                                      310/313 B
6,710,677 B2 *  3/2004  Beaudin ................ H03H 9/547
                                                      330/306
(Continued)

FOREIGN PATENT DOCUMENTS

JP    2000-174585 A  *  6/2000
JP    2010-109694 A     5/2010
(Continued)

OTHER PUBLICATIONS

Official Communication issued in International Patent Application No. PCT/JP20161085989, dated Feb. 14, 2017.

*Primary Examiner* — Barbara Summons
(74) *Attorney, Agent, or Firm* — Keating & Bennett, LLP

(57) ABSTRACT

A band elimination filter includes a plurality of parallel resonators, each including a piezoelectric substrate and an IDT electrode on a surface of the piezoelectric substrate. The IDT electrode includes a pair of comb-shaped electrodes opposing each other, and the IDT electrode includes electrode fingers, a pitch of the electrode fingers being different between an end portion of the IDT electrode in a propagation direction of an elastic wave and a central portion of the IDT electrode different from the end portion.

21 Claims, 8 Drawing Sheets

(51) Int. Cl.
 *H01P 1/203* (2006.01)
 *H03H 9/02* (2006.01)
(52) U.S. Cl.
 CPC .... *H03H 9/14576* (2013.01); *H03H 9/14582* (2013.01); *H03H 9/6409* (2013.01); *H03H 9/6426* (2013.01)
(58) Field of Classification Search
 CPC ...... H03H 9/25; H03H 9/6409; H03H 9/6426; H03H 9/6483; H01L 41/047; H01P 1/20336; H01P 1/205
 USPC .................................................. 333/193, 195
 See application file for complete search history.

(56) References Cited

U.S. PATENT DOCUMENTS

| | | | | |
|---|---|---|---|---|
| 6,946,932 | B2* | 9/2005 | Takagi | H03H 9/02551 310/10 |
| 7,679,474 | B2* | 3/2010 | Igaki | H03H 9/14544 310/313 D |
| 2005/0099244 | A1* | 5/2005 | Nakamura | H03H 9/02118 333/133 |
| 2008/0018417 | A1 | 1/2008 | Igaki et al. | |
| 2008/0258983 | A1* | 10/2008 | Bauer | H03H 9/6409 343/722 |
| 2010/0026417 | A1* | 2/2010 | Kubat | H03H 9/0038 333/133 |
| 2010/0109802 | A1 | 5/2010 | Tanaka | |
| 2012/0188026 | A1 | 7/2012 | Yamaji et al. | |
| 2012/0306595 | A1* | 12/2012 | Omote | H03H 9/6433 333/195 |
| 2014/0070906 | A1 | 3/2014 | Ikeuchi et al. | |
| 2015/0130680 | A1* | 5/2015 | Link | H03H 9/547 343/852 |

FOREIGN PATENT DOCUMENTS

| | | |
|---|---|---|
| JP | 2012-156741 A | 8/2012 |
| JP | 2012-175438 A * | 9/2012 |
| WO | 2005/107069 A1 | 11/2005 |
| WO | 2013/069225 A1 | 5/2013 |

* cited by examiner

ELIMINATION BAND WIDTH

BAND ELIMINATION FILTER AND COMPOSITE FILTER

CROSS REFERENCE TO RELATED APPLICATIONS

This application claims the benefit of priority to Japanese Patent Application No. 2016-038458 filed on Feb. 29, 2016 and is a Continuation Application of PCT Application No. PCT/JP2016/085989 filed on Dec. 2, 2016. The entire contents of each application are hereby incorporated herein by reference.

BACKGROUND OF THE INVENTION

1. Field of the Invention

The present invention relates to a band elimination filter that blocks passage of a signal in a predetermined frequency band, and to a composite filter including the band elimination filter.

2. Description of the Related Art

Until recently, there are known composite filters each including a plurality of resonators connected in series and in parallel.

Japanese Unexamined Patent Application Publication No. 2010-109694 discloses, as one type of those composite filters, a band pass filter in which a plurality of surface acoustic wave resonators each defined by a pair of comb-shaped electrodes are connected in series and in parallel.

In the band pass filter disclosed in Japanese Unexamined Patent Application Publication No. 2010-109694, an attenuation is ensured by connecting the resonators in parallel to form a trap, but a problem arises in that a band width of an attenuation range cannot be widened just by simply connecting the resonators in parallel.

SUMMARY OF THE INVENTION

Preferred embodiments of the present invention provide band elimination filters in each of which an out-of-band attenuation is able to be increased, that is, an elimination band width is able to be widened, by setting resonance frequencies of a plurality of resonators connected in parallel apart from each other, and composite filters including the band elimination filters.

According to a preferred embodiment of the present invention, a band elimination filter includes a plurality of parallel resonators, wherein each of the plurality of parallel resonators includes a piezoelectric substrate and an IDT electrode provided on a surface of the piezoelectric substrate, the IDT electrode includes a pair of comb-shaped electrodes opposing each other, and the IDT electrode includes a plurality of electrode fingers, a pitch of the electrode fingers being different between an end portion of the IDT electrode in a propagation direction of an elastic wave and a central portion different from the end portion.

By setting the pitch of the electrode fingers in the central portion of the IDT electrode and the pitch of the electrode fingers in the end portion thereof to be different from each other as described above, a wavelength specified in the central portion of the IDT electrode and a wavelength specified in the end portion thereof are different from each other. Accordingly, a plurality of resonance points having different resonant frequencies are obtained in frequency characteristics of the parallel resonator. As a result, an elimination band width is able to be widened in the band elimination filter defined by the plurality of parallel resonators.

The pitch of the electrode fingers in the end portion may be smaller than the pitch of the electrode fingers in the central portion.

By setting the pitch of the electrode fingers in the end portion of the IDT electrode to be smaller than the pitch of the electrode fingers in the central portion thereof as described above, the wavelength specified in the end portion of the IDT electrode is shorter than that specified in the central portion thereof. Accordingly, in the frequency characteristics of the parallel resonator, a plurality of resonance points having different resonant frequencies are obtained, e.g., a resonance point specified by the pitch of the electrode fingers in the central portion and positioned on the lower frequency side and a resonance point specified by the pitch of the electrode fingers in the end portion and positioned on the higher frequency side. As a result, an elimination band width ranging from the resonance point on the lower frequency side to the resonance point on the higher frequency side is able to be widened in the band elimination filter defined by the plurality of parallel resonators.

The plurality of parallel resonators may include a first parallel resonator and a second parallel resonator having a higher resonant frequency than the first parallel resonator, and $E1 < C2 < C1$ may be satisfied, where a pitch of the electrode fingers in the central portion of the first parallel resonator is denoted by $C1$, a pitch of the electrode fingers in the end portion of the first parallel resonator is denoted by $E1$, and a pitch of the electrode fingers in the central portion of the second parallel resonator is denoted by $C2$.

With the above-described features, a band ranging between the resonance points of the first parallel resonator and a band ranging between the resonance points of the second parallel resonator partially overlap each other. As a result, peaks and valleys in frequency characteristics of the first parallel resonator and the second parallel resonator partially cancel each other, such that level differences in impedance at attenuation poles are reduced and the band elimination filter having a wider elimination band width is obtained.

$E2 < E1$ may be further satisfied, where a pitch of the electrode fingers in the end portion of the second parallel resonator is denoted by $E2$.

With the above-described feature, cancellation of the peaks and the valleys in the frequency characteristics is achieved in both of the band ranging between the resonance points of the first parallel resonator and the band ranging between the resonance points of the second parallel resonator. As a result, the peaks and the valleys in the frequency characteristics of the first parallel resonator and the second parallel resonator partially cancel each other, such that level differences in impedance at attenuation poles are reduced and the band elimination filter having a wider elimination band width is obtained.

$Ek < C(k+1) < Ck$ may be satisfied, where the plurality of parallel resonators are denoted by a k-th parallel resonator, a (k+1)-th parallel resonator, . . . , and an n-th parallel resonator (k and n are natural numbers satisfying $2 \leq k < n$), having lower resonant frequencies first, that a pitch of the electrode fingers in the central portion of the k-th parallel resonator is denoted by $Ck$, and a pitch of the electrode fingers in the end portion of the k-th parallel resonator is denoted by Ek, and that a pitch of the electrode fingers in the central portion of the (k+1)-th parallel resonator is denoted by C(k+1).

With the above-described features, bands ranging between the resonance points of three or more parallel resonators partially overlap each other. As a result, peaks and valleys in frequency characteristics of the three or more parallel resonators partially cancel each other, such that level differences in impedance at an attenuation poles are reduced and the band elimination filter having a wider elimination band width is obtained.

E(k+1)<Ek may be further satisfied, where a pitch of the electrode fingers in the end portion of the (k+1)-th parallel resonator is denoted by E(k+1).

With the above-described feature, in the band elimination filter including three or more parallel resonators, cancellation of the peaks and the valleys in the frequency characteristics is achieved in the bands ranging between the resonance points of the individual parallel resonators. As a result, the peaks and the valleys in the frequency characteristics of the three or more parallel resonators partially cancel each other, such that level differences in impedance at an attenuation poles are reduced and the band elimination filter having a wider elimination band width is obtained.

The pitch of the electrode fingers in the end portion may be larger than the pitch of the electrode fingers in the central portion.

By setting the pitch of the electrode fingers in the end portion of the IDT electrode to be larger than the pitch of the electrode fingers in the central portion thereof as described above, the wavelength specified in the end portion of the IDT electrode is able to be made longer than that specified in the central portion thereof. Accordingly, in the frequency characteristics of the parallel resonator, a plurality of resonance points having different resonant frequencies are obtained, e.g., a resonance point specified by the pitch of the electrode fingers in the central portion and positioned on the higher frequency side and a resonance point specified by the pitch of the electrode fingers in the end portion and positioned on the lower frequency side. As a result, an elimination band width ranging from the resonance point on the lower frequency side to the resonance point on the higher frequency side is able to be widened in the band elimination filter including the plurality of parallel resonators The plurality of parallel resonators may include a first parallel resonator and a second parallel resonator having a lower resonant frequency than the first parallel resonator, and E1> C2> C1 may be satisfied, where a pitch of the electrode fingers in the central portion of the first parallel resonator is denoted by C1, a pitch of the electrode fingers in the end portion of the first parallel resonator is denoted by E1, and a pitch of the electrode fingers in the central portion of the second parallel resonator is denoted by C2.

With the above-described features, a band ranging between the resonance points of the first parallel resonator and a band ranging between the resonance points of the second parallel resonator partially overlap each other. As a result, peaks and valleys in frequency characteristics of the first parallel resonator and the second parallel resonator partially cancel each other, such that level differences in impedance at an attenuation poles are reduced and the band elimination filter having a wider elimination band width is obtained.

E2> E1 may be further satisfied, where a pitch of the electrode fingers in the end portion of the second parallel resonator is denoted by E2.

With the above-described feature, cancellation of the peaks and the valleys in the frequency characteristics is achieved in both of the band ranging between the resonance points of the first parallel resonator and the band ranging between the resonance points of the second parallel resonator. As a result, the peaks and the valleys in the frequency characteristics of the first parallel resonator and the second parallel resonator partially cancel each other, such that level differences in impedance at an attenuation poles is reduced and the band elimination filter having a wider elimination band width is obtained.

Ek> C(k+1)> Ck may be satisfied, where the plurality of parallel resonators are denoted by a k-th parallel resonator, a (k+1)-th parallel resonator, . . . , and an n-th parallel resonator (k and n are natural numbers satisfying 2≤k<n), having a higher resonant frequency first, a pitch of the electrode fingers in the central portion of the k-th parallel resonator is denoted by Ck, and a pitch of the electrode fingers in the end portion of the k-th parallel resonator is denoted by Ek, and a pitch of the electrode fingers in the central portion of the (k+1)-th parallel resonator is denoted by C(k+1).

With the above-described features, bands ranging between the resonance points of three or more parallel resonators partially overlap each other. As a result, peaks and valleys in frequency characteristics of the three or more parallel resonators partially cancel each other, such that level differences in impedance at an attenuation poles are reduced and the band elimination filter having a wider elimination band width is obtained.

E(k+1)> Ek may be further satisfied, where a pitch of the electrode fingers in the end portion of the (k+1)-th parallel resonator is denoted by E(k+1).

With the above-described feature, in the band elimination filter including three or more parallel resonators, cancellation of the peaks and the valleys in the frequency characteristics is achieved in the bands ranging between the resonance points of the individual parallel resonators. As a result, the peaks and the valleys in the frequency characteristics of the three or more parallel resonators partially cancel each other, such that level differences in impedance at an attenuation poles are reduced and the band elimination filter having a wider elimination band width is obtained.

A composite filter according to a preferred embodiment of the present invention includes a band pass filter, and a band elimination filter according to a preferred embodiment of the present invention connected to the band pass filter.

With the above-described feature, a composite filter capable of widening the elimination band width is obtained.

Band elimination filters and composite filters according to preferred embodiments of the present invention are able to widen the band elimination width.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
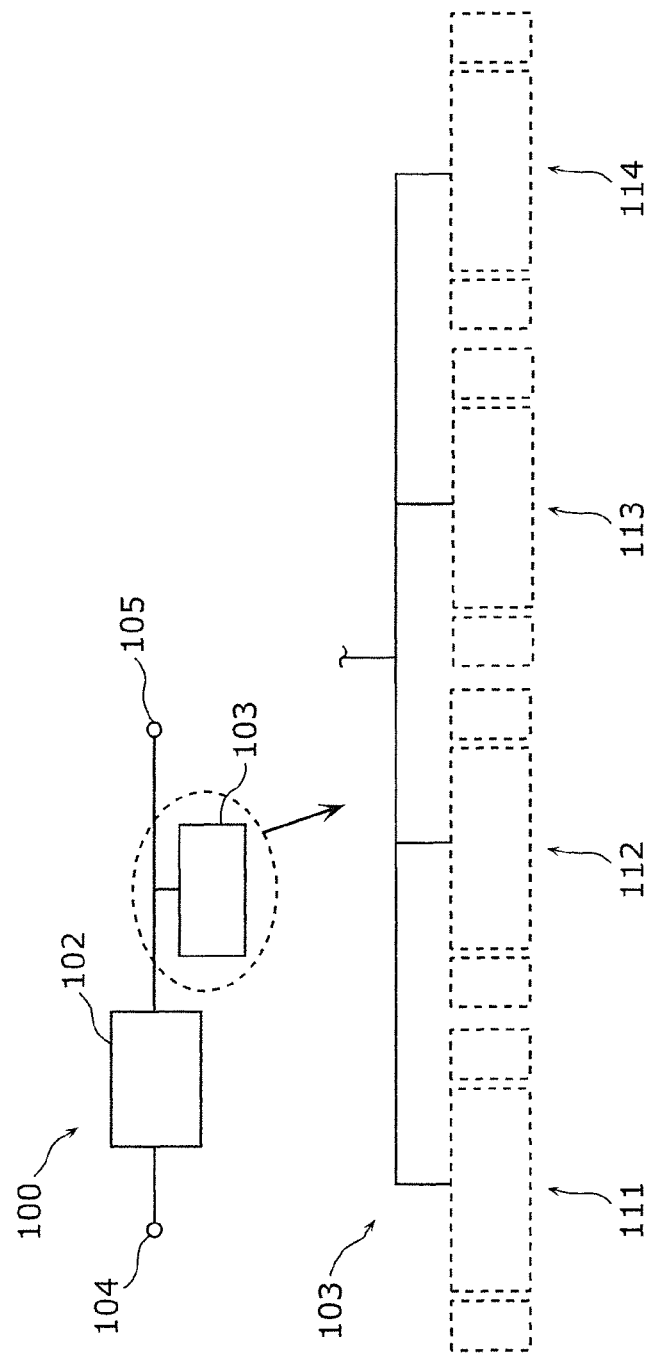
FIG. 1 is a schematic view of a composite filter according to a comparative example, and a band elimination filter included in the composite filter.

Preferred embodiments of the present invention will be described in detail below with reference to examples and drawings. It is to be noted that any of the following preferred embodiments represents a generic or specific example. Numerical values, shapes, materials, elements, arrangements and connection structures of the elements, etc., which are described in the following preferred embodiments, are merely illustrative, and they are not purported to limit the scope of the present invention. Among the elements or features in the following preferred embodiments, the elements or features not recited in independent claims are explained as optional elements. Sizes or relative size ratios of the elements illustrated in the drawings are not always exactly true in a strict sense. In the drawings, the same or substantially the same elements are denoted by the same reference signs, and duplicate description of those elements is omitted or simplified in some cases.

Preferred Embodiment 1

A band elimination filter according to Preferred Embodiment 1 of the present invention is included in a circuit module of a wireless communication unit, for example, to block passage of a signal in a predetermined frequency band.

Prior to describing the band elimination filter according to the present preferred embodiment, the problem with a band elimination filter of the related art is described. FIG. 1 is a schematic view of a composite filter 100 according to a comparative example, and a band elimination filter 103 included in the composite filter 100.

The composite filter 100 according to the comparative example includes a band pass filter 102 allowing a signal with a predetermined frequency to pass therethrough, and a band elimination filter 103 blocking passage of a signal in a predetermined band. An input terminal 104 and an output terminal 105 are disposed at opposite ends of the band pass filter 102 in a one-to-one relationship. The band elimination filter 103 preferably includes four parallel resonators 111, 112, 113 and 114, for example. Each of the parallel resonators 111, 112, 113 and 114 is preferably defined by a surface acoustic wave resonator, for example, and includes a piezoelectric substrate and an IDT electrode provided on a surface of the piezoelectric substrate. One end of the band elimination filter 103 is connected to a junction between the band pass filter 102 and the output terminal 105, and the other end of the band elimination filter 103 is grounded (though not illustrated).

Figure 2A:
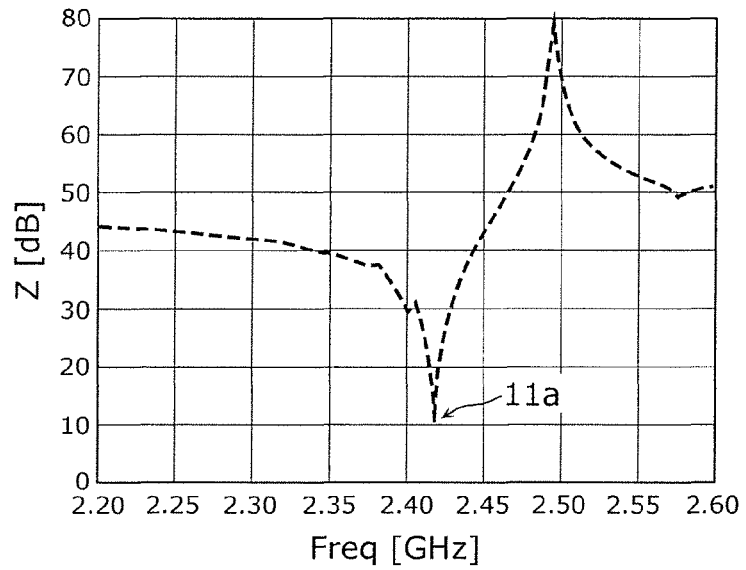
FIG. 2A is a graph depicting frequency characteristics of a parallel resonator defining the band elimination filter according to the comparative example.
Figure 2B:
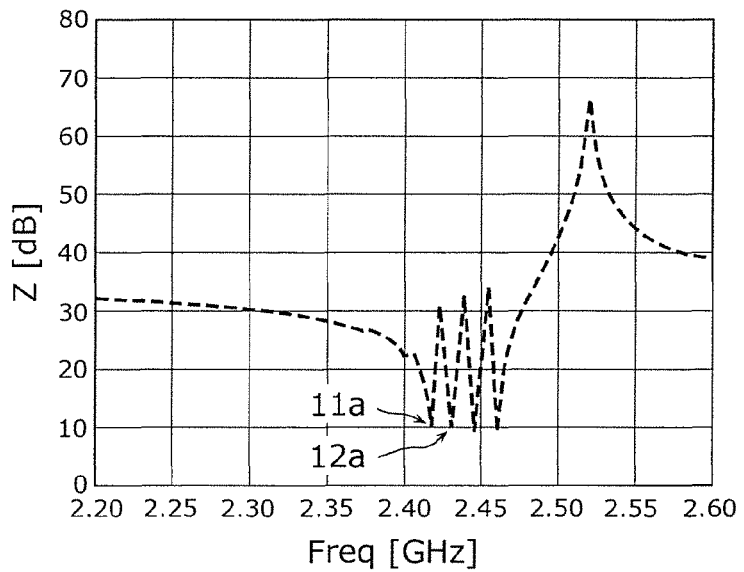
FIG. 2B is a graph depicting frequency characteristics of the band elimination filter according to the comparative example.

FIG. 2A is a graph depicting frequency characteristics of a parallel resonator 111 in the comparative example, and FIG. 2B is a graph depicting frequency characteristics of the band elimination filter 103 according to the comparative example.

As depicted in FIG. 2A, the parallel resonator 111 has one resonance point 11a corresponding to a resonant frequency. In trying to widen an elimination band width of the composite filter 100, it is conceivable to use, as the band elimination filter 103, the plurality of parallel resonators 111 to 114 having different resonant frequencies from one another. However, if the parallel resonators 111, 112, 113 and 114 are designed such that values of their resonant frequencies are spaced from each other at equal or substantially equal intervals, a rebound portion (i.e., a portion projecting in a direction toward a higher impedance level) would be provided, as illustrated in FIG. 2B, between the resonance point 11a of the parallel resonator 111 and a resonance point 12a of the parallel resonator 112. Accordingly, a sufficient elimination band width cannot be ensured in the composite filter 100 according to the comparative example.

The band elimination filter and the composite filter capable of widening an elimination band width are described in this preferred embodiment.

Figure 3:
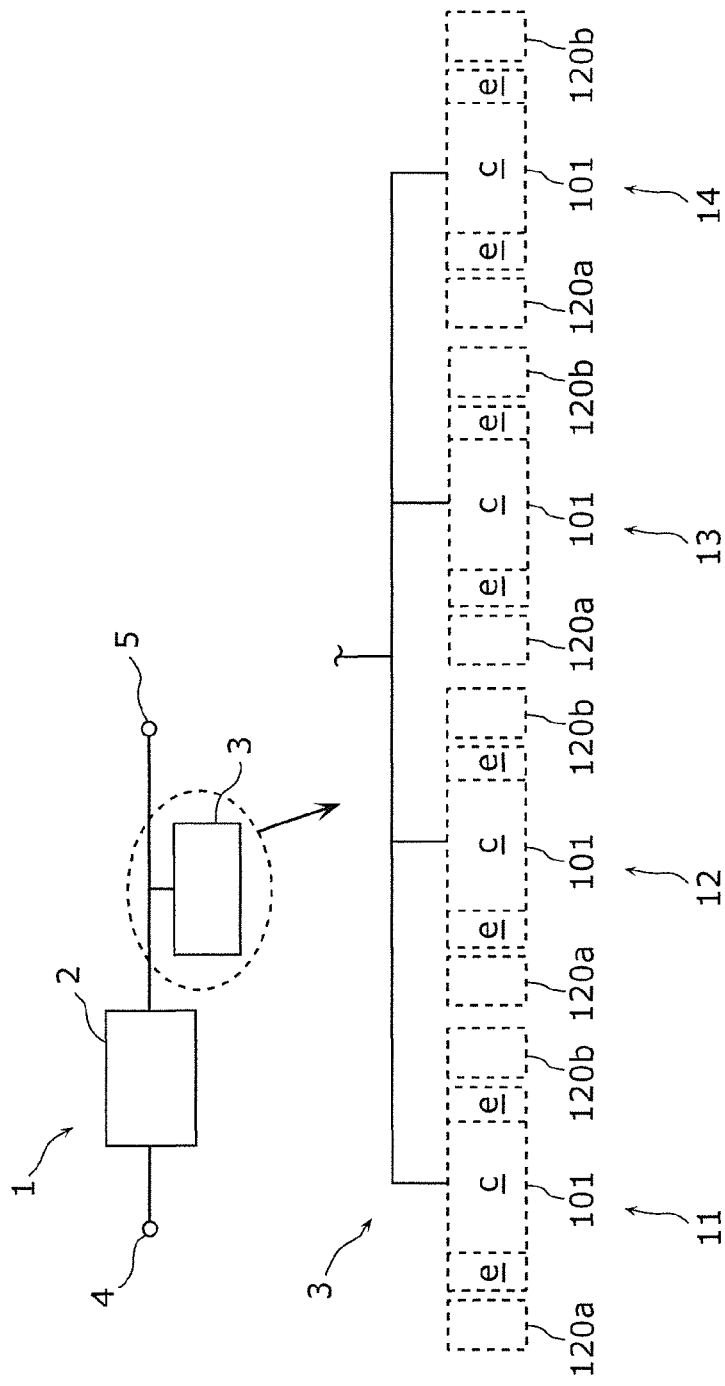
FIG. 3 is a schematic view of a composite filter according to Preferred Embodiment 1 of the present invention, and a band elimination filter included in the composite filter.

FIG. 3 is a schematic view of a composite filter 1 according to Preferred Embodiment 1, and a band elimination filter 3 included in the composite filter 1.

The composite filter 1 includes a band pass filter 2 allowing a signal with a predetermined frequency to pass therethrough, and a band elimination filter 3 blocking passage of a signal in a predetermined band. An input terminal 4 and an output terminal 5 are disposed at opposite ends of the band pass filter 2 in a one-to-one relationship. When the composite filter 1 is used as a circuit module of a wireless communication unit, the input terminal 4 is connected to an antenna element or an antenna switch, and an output terminal 5 is connected to an LNA (Low Noise Amplifier), for example.

The band pass filter 2 is preferably, for example, a ladder surface acoustic wave filter including a plurality of resonators connected in series and in parallel. The band pass filter 2 is not limited to the ladder surface acoustic wave filter, and it may be an LC filter, for example.

As illustrated in FIG. 3, the band elimination filter 3 preferably includes four parallel resonators 11, 12, 13 and 14, for example. The number of parallel resonators defining the band elimination filter 3 is not limited to four, and it may be any suitable number of not less than two and not more than 10, for example.

Each of the parallel resonators 11 to 14 is preferably a surface acoustic wave resonator, for example, and includes an IDT (Inter Digital Transducer) electrode 101 provided on a surface of a piezoelectric substrate. Reflectors 120a and 120b are arranged outside opposite ends of the IDT electrode 101 in a one-to-one relationship. The IDT electrode 101 includes a pair of comb-shaped electrodes opposing each other. The IDT electrode 101 includes a central portion c and end portions e when viewed in plan, the central portion c and the end portions e being different in structure from each other. The difference in structure will be described below later.

One end of the band elimination filter 3 is connected to a junction between the band pass filter 2 and the output terminal 5, and the other end of the band elimination filter 3 is grounded (though not illustrated). The band elimination filter 3 guides a signal component in a predetermined band, which has passed through the band pass filter 2, to the ground side, thus preventing the signal component in the predetermined band from being output through the output terminal 5.

The parallel resonators 11 to 14 defining the band elimination filter 3 will be described below. Here, a typical structure of the parallel resonators 11 to 14 is described by taking the parallel resonator 11 among the four parallel resonators 11 to 14 as a typical example.

Figures 4A, 4B:
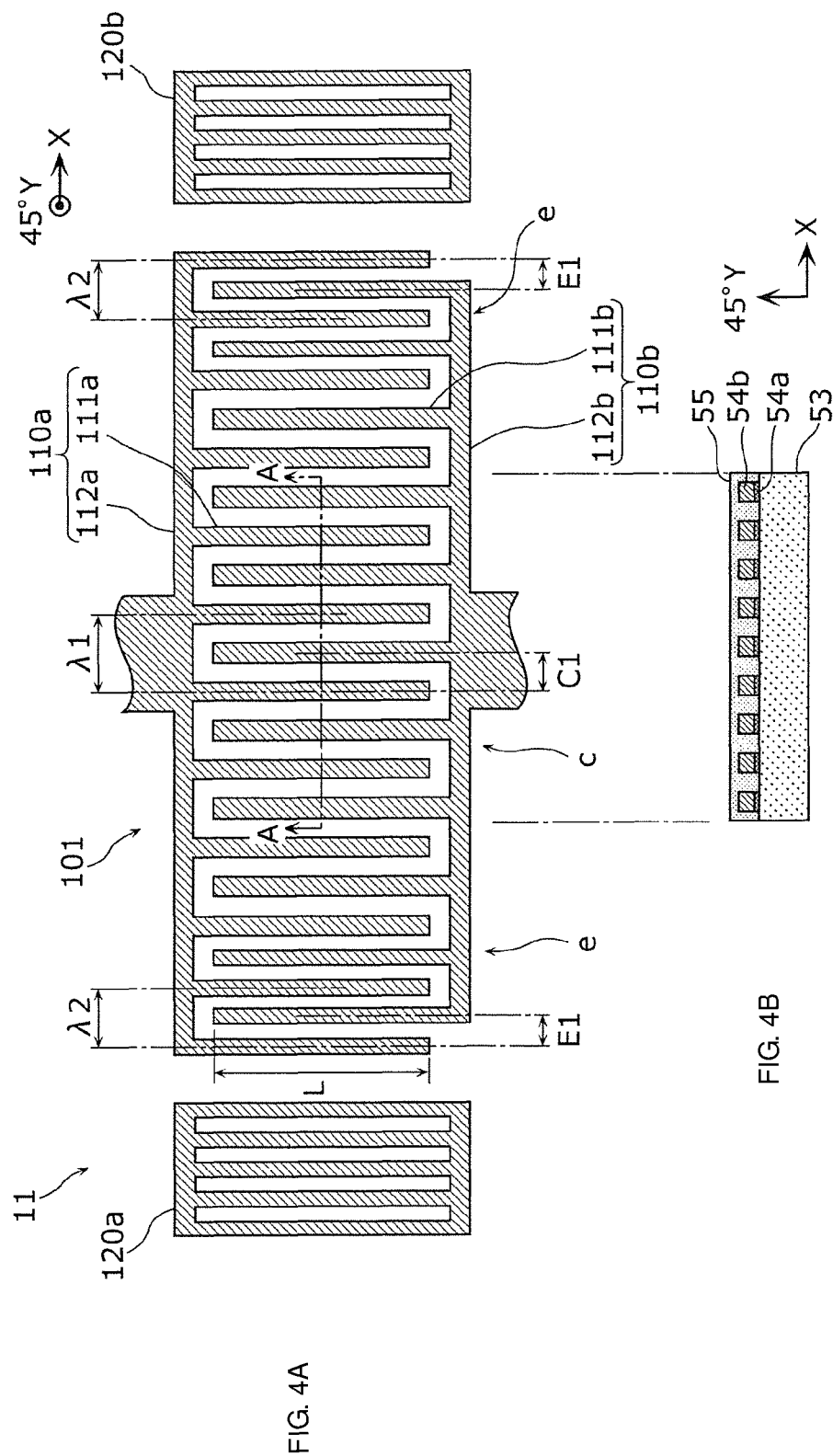
FIG. 4A is a schematic plan view of a parallel resonator defining the band elimination filter according to Preferred Embodiment 1 of the present invention.
FIG. 4B is a sectional view taken along a line A-A.

FIG. 4A is a schematic plan view of the parallel resonator 11, and FIG. 4B is a sectional view taken along a line A-A.

The parallel resonator 11 includes, as described above, a piezoelectric substrate 53 and the IDT electrode 101 provided on a surface of the piezoelectric substrate 53. The IDT electrode 101 includes a pair of comb-shaped electrodes 110a and 110b opposing each other.

As illustrated in FIG. 4A, the comb-shaped electrode 110a includes a plurality of electrode fingers 111a parallel or substantially parallel to one another, and a busbar electrode 112a interconnecting the electrode fingers 111a. The comb-shaped electrode 110b includes a plurality of electrode fingers 111b parallel or substantially parallel to one another, and a busbar electrode 112b interconnecting the electrode fingers 111b. The electrode fingers 111a and 111b extend in a direction perpendicular or substantially perpendicular to the propagation direction (X-axis direction) of a surface acoustic wave. In the following, the electrode fingers 111a and 111b are called electrode fingers f when referring to them collectively.

A duty of the electrode fingers f of the IDT electrode 101 in the present preferred embodiment is preferably about 60%, for example. An intersecting width L of the IDT electrode 101 stands for a distance over which the electrode fingers 111a and the electrode fingers 111b overlap when viewed from the X-axis direction. For example, preferably, the intersecting width L=about 20 μm. The number of pairs of the electrode fingers f is preferably, for example, 51 in the central portion c of the IDT electrode 101, 5 in one end portion e, and 5 in the other end portion e. However, the numbers of the electrode fingers f are not limited to the above-described ones. It is preferable that the number of the electrode fingers f in the central portion c occupies about 70% to about 90%, for example, among a total number of the electrode fingers f.

As illustrated in FIG. 4B, the IDT electrode 101 has a multilayer structure including a close contact layer 54a and a main electrode layer 54b. The close contact layer 54a increases adhesion between the piezoelectric substrate 53 and the main electrode layer 54b. For example, Ti is preferably used as a material of the close contact layer 54a. For example, Al including about 1% of Cu, for example, is used as a material of the main electrode layer 54b. A film thickness of the main electrode layer 54b is preferably about 115 nm, for example. A protective layer 55 covers the IDT electrode 101. The protective layer 55 protects the main electrode layer 54b against external environments, to adjust frequency—temperature characteristics, and to increase moisture resistance. The protective layer 55 is preferably made of a film including, for example, silicon dioxide as a main ingredient. The piezoelectric substrate 53 is preferably made of, for example, a 45° Y cut X SAW propagation LiTaO$_3$ piezoelectric single crystal or piezoelectric ceramic.

A relationship between the pitch of the electrode fingers f in the central portion c of the IDT electrode 101 and the pitch of the electrode fingers f in the end portion e is now described with reference to FIGS. 4A, 4B, 5A and 5B.

As illustrated in FIGS. 4A and 4B, the pitch of the electrode fingers f is different between the end portion e and the central portion c of the IDT electrode 101 in the propagation direction (X-axis direction) of the surface acoustic wave. The end portion e denotes a portion that is defined by the plurality of electrode fingers 111a and 111b on the outer side including an outermost end of the IDT electrode 101 in the propagation direction (X-axis direction) of a surface acoustic wave. The central portion c denotes a portion different from the end portion e of the IDT electrode 101. A wavelength of the surface acoustic wave resonator is specified by the repetition pitch of the electrode fingers f defining the IDT electrode 101. Therefore, the parallel resonator 11 has two wavelengths, i.e., a wavelength λ1 reflecting the pitch of the central portion c, and a wavelength λ2 reflecting the pitch of the end portion e.

More specifically, in the IDT electrode 101, a pitch E1 of the electrode fingers f in the end portion e is preferably smaller than a pitch C1 of the electrode fingers f in the central portion c. Thus, the wavelength λ2 specified in the end portion e is shorter than the wavelength λ1 specified in the central portion c.

Figure 5A:
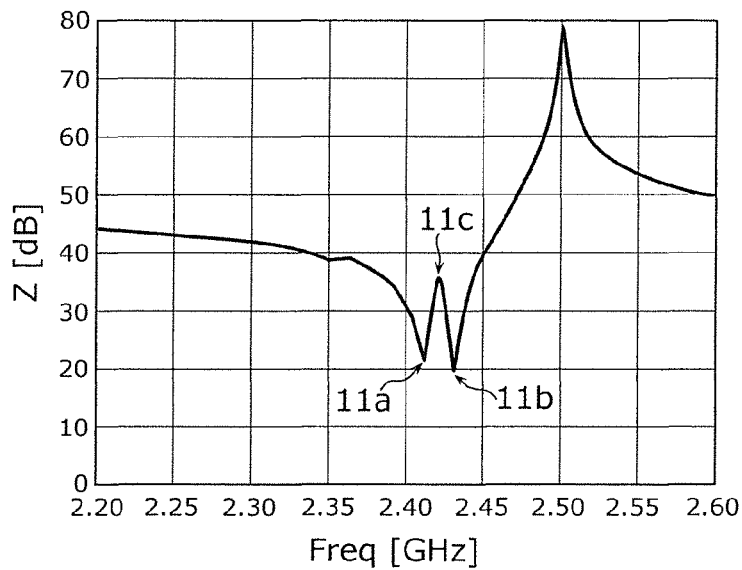
FIG. 5A is a graph depicting frequency characteristics of the parallel resonator defining the band elimination filter according to Preferred Embodiment 1 of the present invention.

Accordingly, as illustrated in FIG. 5A, two valleys and one peak appear in a resonant frequency band of the parallel resonator 11. The two valleys at resonant frequencies correspond to resonance points 11a and 11b of the parallel resonator 11. Of the two resonance points 11a and 11b, the resonance point 11a specified by the pitch of the electrode fingers f in the central portion c is positioned on the lower frequency side than the resonance point 11b specified by the pitch of the electrode fingers f in the end portion e. The peak in the resonant frequency band represents a rebound portion 11c between the resonance points 11a and 11b.

Figure 5B:
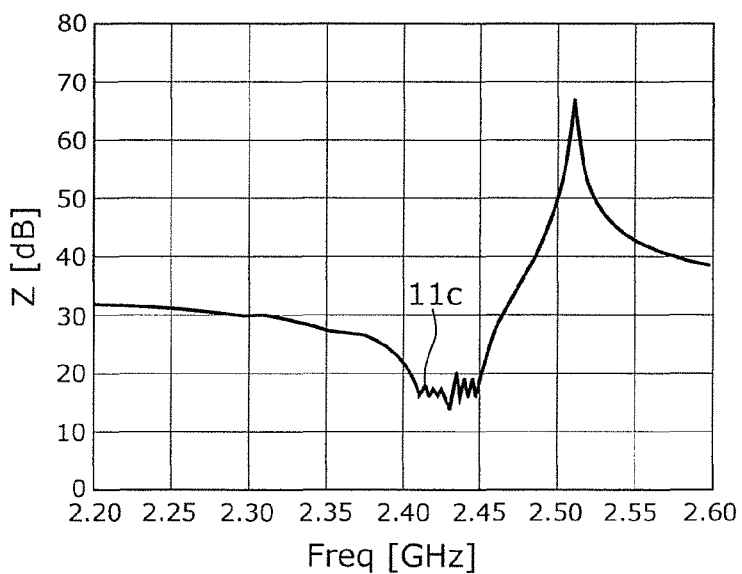
FIG. 5B is a graph depicting frequency characteristics of the band elimination filter according to Preferred Embodiment 1 of the present invention.

By fabricating, for example, the parallel resonators 11 and 12 each including an electrode finger portion with a relatively narrow pitch and having two resonance points such that the resonant frequencies of the parallel resonators are appropriately spaced apart from each other, it is possible to obtain the band elimination filter 3 in which the height of the rebound portion 11c is relatively low and the elimination band width is relatively wide, as illustrated in FIG. 5B.

Configurations of the parallel resonators 11 to 14 each having two resonance points will be described below.

Here the parallel resonators 11 to 14 are denoted by the first parallel resonator 11, the second parallel resonator 12, the third parallel resonator 13, and the fourth parallel resonator 14, having lower resonant frequencies first. Furthermore, assuming that the pitches of the electrode fingers f in the central portions c of the parallel resonators 11 to 14 and the pitches of the electrode fingers f in the end portions e are denoted as per (1) to (4) below:

(1) the pitch of the electrode fingers in the first parallel resonator 11 is C1 in the central portion c and is E1 in the end portion e;

(2) the pitch of the electrode fingers in the second parallel resonator 12 is C2 in the central portion c and is E2 in the end portion e;

(3) the pitch of the electrode fingers in the third parallel resonator 13 is C3 in the central portion c and is E3 in the end portion e; and (4) the pitch of the electrode fingers in the fourth parallel resonator 14 is C4 in the central portion c and is E4 in the end portion e;

the following relations (a) to (c) are satisfied in this preferred embodiment:

$$E1<C2<C1 \quad (a)$$

$$E2<C3<C2 \quad (b)$$

$$E3<C4<C3 \quad (c)$$

In addition, the pitches of the electrode fingers f in the individual end portions e satisfy the following relation (d):

$$E4<E3<E2<E1. \quad (d)$$

More specifically, the pitches of the electrode fingers f are given by values indicated in Table 1.

TABLE 1

| | Electrode Fingers | |
|---|---|---|
| | Pitch in Central Portion (μm) | Pitch in End Portion (μm) |
| First Parallel Resonator | 1.6174 | 1.5851 |
| Second Parallel Resonator | 1.6129 | 1.5806 |
| Third Parallel Resonator | 1.6084 | 1.5762 |
| Fourth Parallel Resonator | 1.6049 | 1.5728 |

The relationships represented by (a) to (c) above imply, for example, that the wavelength λ2 specified in the end portion e among the electrode fingers f of the first parallel resonator 11 is shorter than the wavelength λ1 specified in the central portion c among the electrode fingers f of the second parallel resonator 12. In other words, the above relationships imply that a band ranging between the two resonance points 11a and 11b of the first parallel resonator 11 partially overlaps a band ranging between the two resonance points 12a and 12b of the second parallel resonator 12.

Figure 6A:
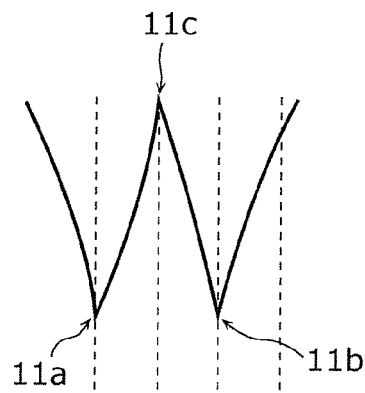
FIGS. 6A to 6C are conceptual views to explain frequency characteristics of the band elimination filter.
Figure 6B:
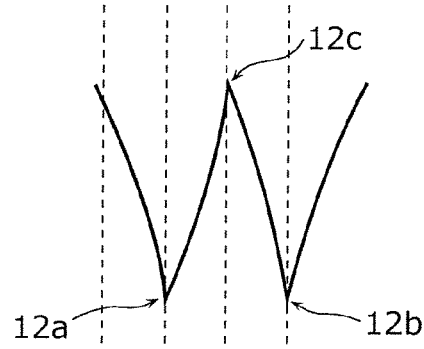
Figure 6C:
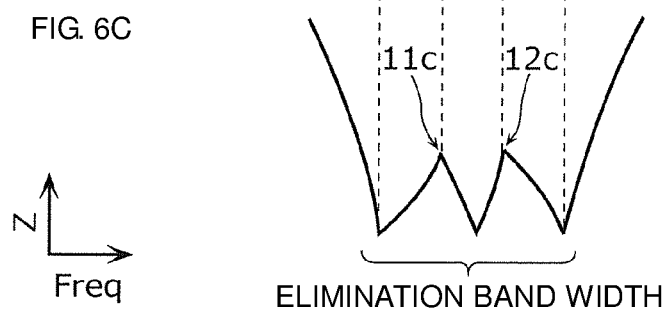

Such a relationship is described in more detail with reference to FIGS. 6A to 6C. FIGS. 6A to 6C are conceptual views to explain frequency characteristics of the band elimination filter 3.

As illustrated in FIG. 6A, the two resonance points 11a and 11b and the rebound portion 11c positioned between the resonance points 11a and 11b exist in the resonant frequency band of the first parallel resonator 11. The resonance point 11a represents the resonant frequency specified by the pitch of the electrode fingers f in the central portion c, and the resonance point 11b represents the resonant frequency specified by the pitch of the electrode fingers f in the end portion e. The rebound portion 11c represents a portion projecting in the direction toward the higher impedance level between the two resonance points 11a and 11b.

As illustrated in FIG. 6B, the second parallel resonator has a higher resonant frequency than the first parallel resonator 11. The two resonance points 12a and 12b and the rebound portion 12c positioned between the resonance points 12a and 12b exist in the resonant frequency band of the second parallel resonator 12. The resonance point 12a represents the resonant frequency specified by the pitch of the electrode fingers f in the central portion c, and the resonance point 12b represents the resonant frequency specified by the pitch of the electrode fingers f in the end portion e. The rebound portion 12c represents a portion projecting in the direction toward the higher impedance level between the two resonance points 12a and 12b.

The second parallel resonator 12 is designed such that the resonance point 12a is aligned or substantially aligned with the rebound portion 11c of the first parallel resonator 11, and that the rebound portion 12c is aligned or substantially aligned with the resonance point 11b of the first parallel resonator 11. Accordingly, when the first parallel resonator 11 and the second parallel resonator 12 are connected in parallel, the band ranging between the two resonance points 11a and 11b of the first parallel resonator 11 partially overlaps the band ranging between the two resonance points 12a and 12b of the second parallel resonator 12.

Thus, as illustrated in FIG. 6C, when the first parallel resonator 11 and the second parallel resonator 12 are connected in parallel, the peaks and the valleys in the frequency characteristics of the two parallel resonators partially cancel each other, and the heights of the rebound portions 11c and 12c are reduced. As a result, the elimination band width is able to be widened in the band elimination filter 3 in which the first parallel resonator 11 and the second parallel resonator 12 are connected in parallel.

The above description has been provided in connection with the two parallel resonators 11 and 12, but it is similarly applied when three or more parallel resonators are provided.

It is to be noted that FIGS. 6A to 6C are conceptual views to assist understanding of the present preferred embodiment, and that the elimination band width becomes more flat in some cases when the peaks and the valleys are overlapped with each other in a slightly shifted relation.

Figure 7:
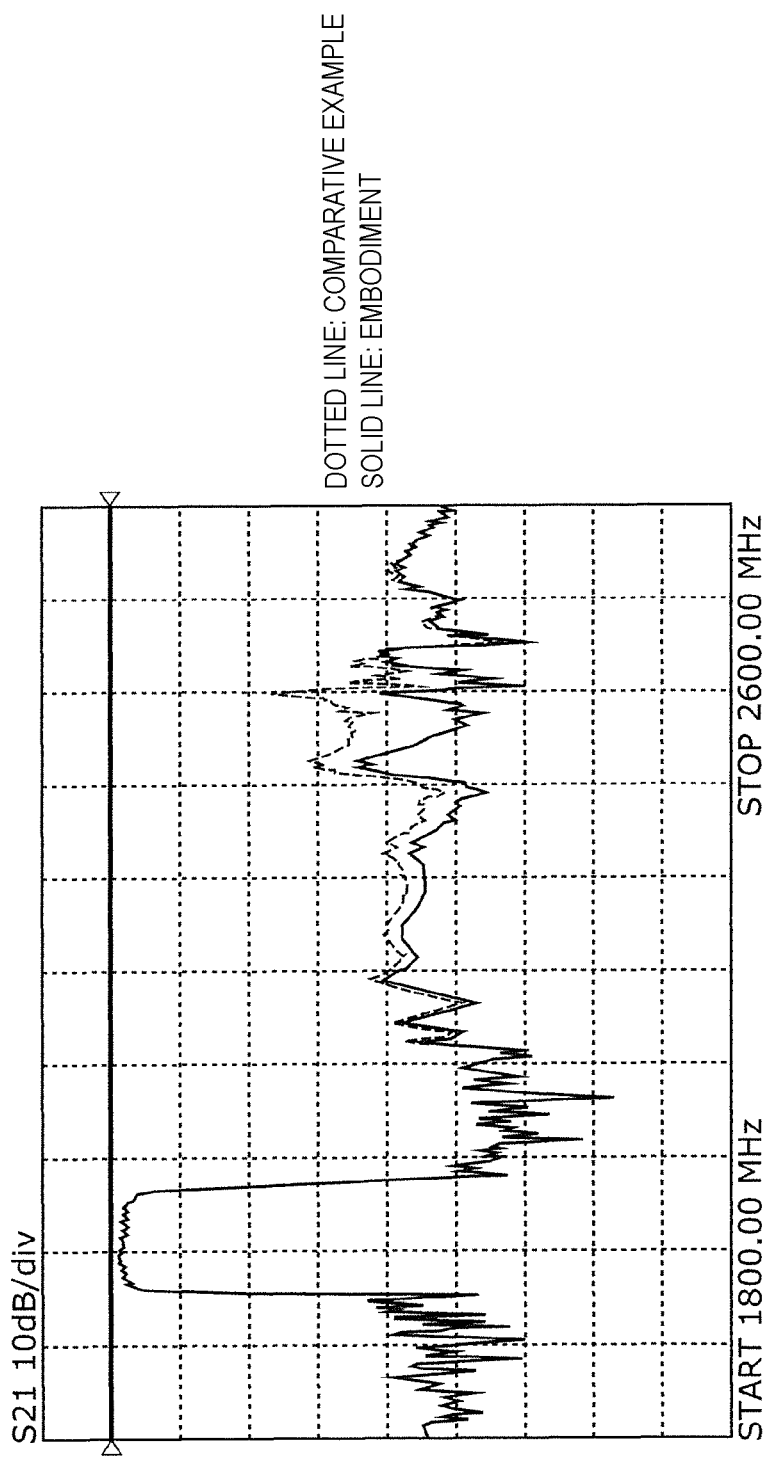
FIG. 7 is a graph depicting frequency characteristics of the composite filters according to Preferred Embodiment 1 of the present invention and the comparative example.

FIG. 7 is a graph depicting frequency characteristics of the composite filter 1 according to Preferred Embodiment 1 and the composite filter 100 according to the comparative example.

As described above, the band elimination filter 3 in the composite filter 1 is connected between the band pass filter 2 and the output terminal 5. The band elimination filter 103 in the composite filter 100 is connected between the band pass filter 102 and the output terminal 105.

Comparing the frequency characteristics on the higher frequency side than pass bands of the band pass filters 2 and 102, as seen from FIG. 7, a band at which an attenuation is larger than that in the comparative example increases in the present preferred embodiment. Thus, the elimination band width is able to be widened in the composite filter 1 according to the present preferred embodiment.

The band elimination filter 3 according to the present preferred embodiment is the band elimination filter 3 including the plurality of parallel resonators 11 to 14, wherein each of the parallel resonators 11 to 14 includes the piezoelectric substrate and the IDT electrode 101 provided on the surface of the piezoelectric substrate 53, the IDT electrode 101 includes the pair of comb-shaped electrodes 110a and 110b opposing each other and includes the plurality of electrode fingers f (111a and 111b), and the pitch of the electrode fingers f (111a and 111b) is different between the end portion e of the IDT electrode 101 in the propagation direction of the elastic wave and the central portion c different from the end portion e.

By setting the pitch of the electrode fingers f in the central portion c of the IDT electrode 101 to be different from the pitch of the electrode fingers f in the end portion e of the IDT electrode 101 as described above, the wavelength λ1 specified in the central portion c of the IDT electrode 101 and the wavelength λ2 specified in the end portion e are different from each other. Therefore, the plurality of resonance points 11a and 11b having different resonant frequencies are obtained in the frequency characteristics of the parallel resonator 11, for example. As a result, the elimination band width is able to be widened in the band elimination filter 3 defined by the plurality of parallel resonators 11 to 14.

While, in the present preferred embodiment, the IDT electrode 101 preferably has two different pitches of the electrode fingers f in the central portion c and the end portion e, for example, the number of different pitches of the electrode fingers f in the IDT electrode 101 is not limited to two. The electrode fingers f may include three or more different pitches, for example.

In the band elimination filter 3, the pitch of the electrode fingers f in the end portion e may be set smaller than the pitch of the electrode fingers f in the central portion c.

By setting the pitch of the electrode fingers f in the end portion e of the IDT electrode 101 to be smaller than the pitch of the electrode fingers f in the central portion c of the IDT electrode 101 as described above, the wavelength $\lambda 2$ specified in the end portion e is shorter than the wavelength $\lambda 1$ specified in the central portion c. Thus, in the frequency characteristics of the parallel resonator 11, for example, the plurality of resonance points 11a and 11b having the different resonant frequencies are able to be obtained, that is, the resonance point 11a specified by the pitch of the electrode fingers f in the central portion c and positioned on the lower frequency side and the resonance point 11b specified by the pitch of the electrode fingers f in the end portion e and positioned on the higher frequency side. As a result, in the band elimination filter 3 including the plurality of parallel resonators 11 to 14, it is possible to widen the elimination band width ranging from the resonance point 11a on the lowest frequency side to the resonance point 11b on the highest frequency side.

While the present preferred embodiment has been described in connection with the example including the four parallel resonators 11 to 14, the number of parallel resonators is not limited to four. The band elimination filter 3 according to the present preferred embodiment may be defined as follows in general expression without including limitation on the number of parallel resonators.

Assuming that the plurality of parallel resonators are denoted by a k-th parallel resonator, a (k+1)-th parallel resonator, . . . , and an n-th parallel resonator (k and n are natural numbers satisfying 1≤k<n), having lower resonant frequencies first, a pitch of the electrode fingers f in the central portions c of the k-th parallel resonator is denoted by Ck, a pitch of the electrode fingers f in the end portion e of the k-th parallel resonator is denoted by Ek, and a pitch of the electrode fingers f in the central portion c of the (k+1)-th parallel resonator is denoted by C(k+1), the band elimination filter 3 according to the present preferred embodiment preferably satisfies Ek<C(k+1)<Ck.

In addition, assuming that a pitch of the electrode fingers f in the end portion e of the (k+1)-th parallel resonator is denoted by E(k+1), E(k+1)<Ek is preferably satisfied.

Under those conditions, bands ranging between the resonance points of the individual parallel resonators partially overlap each other. As a result, peaks and valleys in frequency characteristics of the parallel resonators partially cancel each other, such that level differences in impedance at an attenuation poles are reduced and the band elimination filter 3 having a wider elimination band width is obtained.

Preferred Embodiment 2

In a band elimination filter 3 according to Preferred Embodiment 2 of the present invention, the pitch of the electrode fingers f in the end portion e is preferably larger than that of the electrode fingers f in the central portion c.

Figures 8A, 8B:
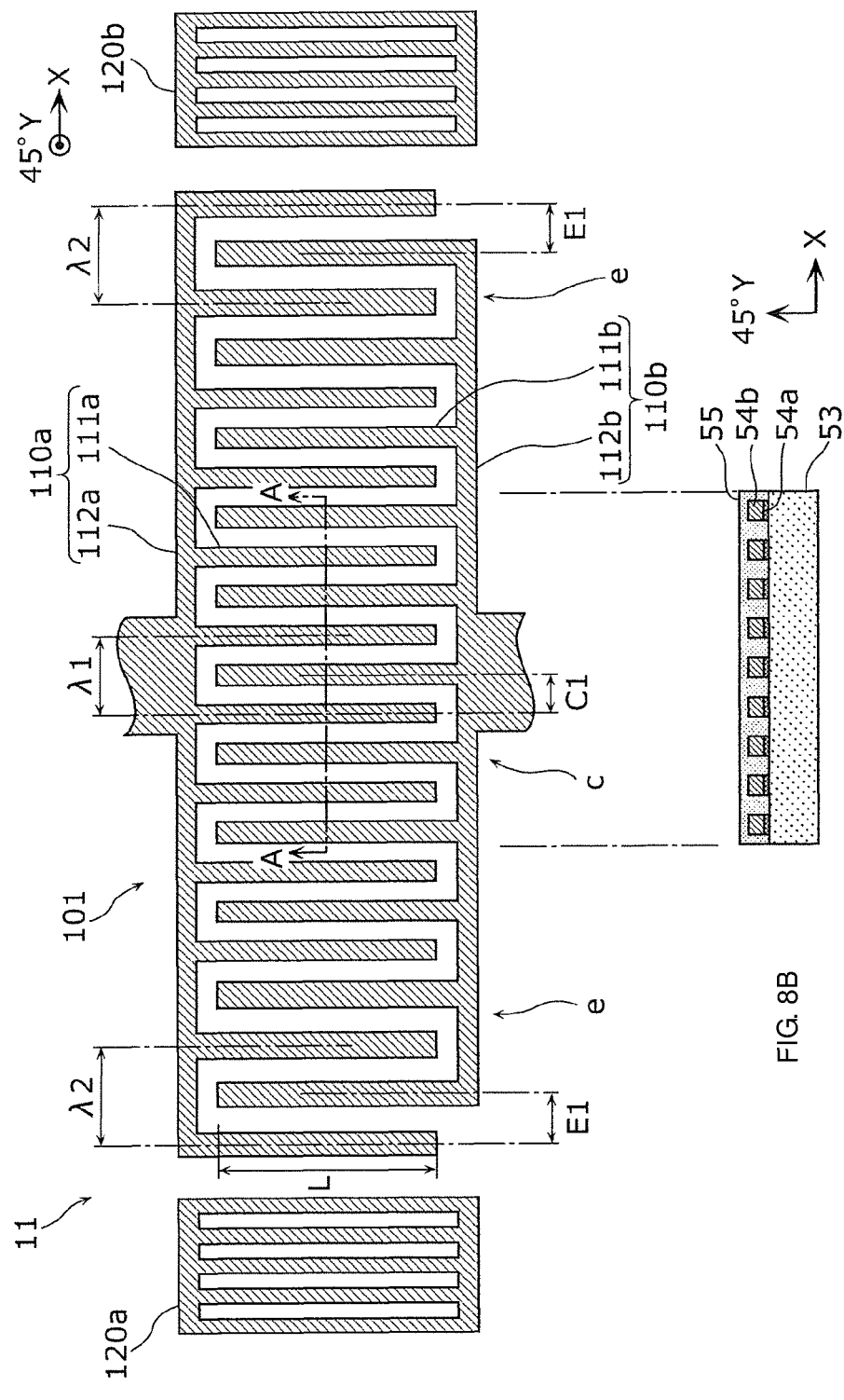
FIG. 8A is a schematic plan view of a parallel resonator defining a band elimination filter according to Preferred Embodiment 2 of the present invention.
FIG. 8B is a sectional view taken along a line A-A.

FIG. 8A is a schematic plan view of a parallel resonator 11 in Preferred Embodiment 2, and FIG. 8B is a sectional view taken along a line A-A.

A relationship between the pitch of the electrode fingers 111a and 111b in the central portion c of the IDT electrode 101 and the pitch of the electrode fingers 111a and 111b in the end portion e in Preferred Embodiment 2 is described with reference to FIGS. 8A and 8B.

In the IDT electrode 101, as illustrated in FIG. 8A, the pitch E1 of the electrode fingers f in the end portion e is preferably larger than the pitch C1 of the electrode fingers f in the central portion c. Thus, the wavelength $\lambda 2$ specified in the end portion e is longer than the wavelength $\lambda 1$ specified in the central portion c.

Accordingly, two valleys and one peak appear at a resonant frequency band of the parallel resonator 11. The two valleys at the resonant frequency band correspond to two resonance points of the parallel resonator 11. Of the two resonance points, the resonance point specified by the pitch of the electrode fingers f in the central portion c is positioned on the higher frequency side than the resonance point specified by the pitch the electrode fingers f in the end portion e.

By fabricating, for example, the parallel resonators 11 and 12 each having two resonance points such that the resonant frequencies of the parallel resonators are appropriately spaced apart from each other, it is possible to obtain the band elimination filter 3 in which the height of the rebound portion is relatively low and the elimination band width is relatively wide.

Configurations of the parallel resonators 11 to 14 each having two resonance points will be described below.

Here the parallel resonators 11 to 14 are denoted by the first parallel resonator 11, the second parallel resonator 12, the third parallel resonator 13, and the fourth parallel resonator 14, having a higher resonant frequency first. Furthermore, assuming that the pitches of the electrode fingers fin the central portions c of the parallel resonators 11 to 14 and the pitches of the electrode fingers f in the end portions e are denoted as per (1) to (4) below:

(1) the pitch of the electrode fingers in the first parallel resonator 11 is C1 in the central portion c and is E1 in the end portion e;

(2) the pitch of the electrode fingers in the second parallel resonator 12 is C2 in the central portion c and is E2 in the end portion e;

(3) the pitch of the electrode fingers in the third parallel resonator 13 is C3 in the central portion c and is E3 in the end portion e; and (4) the pitch of the electrode fingers in the fourth parallel resonator 14 is C4 in the central portion c and is E4 in the end portion e;

the following relationships (a) to (c) are satisfied in the present preferred embodiment:

$$E1 > C2 > C1 \quad (a)$$

$$E2 > C3 > C2 \quad (b)$$

$$E3 > C4 > C3 \quad (c)$$

In addition, the pitches of the electrode fingers f in the end portions e satisfy the following relation (d):

$$E4 > E3 > E2 > E1 \quad (d)$$

The relationships represented by the (a) to (c) above imply, for example, that the wavelength $\lambda 2$ specified in the end portion e among the electrode fingers f of the first parallel resonator 11 is longer than the wavelength λ1 specified in the central portion c among the electrode fingers f of the second parallel resonator 12. In other words, the relationships above imply that a band ranging between the two resonance points of the first parallel resonator 11 partially overlaps a band ranging between the two resonance points of the second parallel resonator 12.

Under those conditions, the elimination band width is widened, and level differences of impedance in the elimination band are reduced in the band elimination filter 3 including the first parallel resonator 11 and the second parallel resonator 12 connected in parallel. The above description has been provided in connection with the two parallel resonators 11 and 12, but it is similarly applied to the case of including three or more parallel resonators, for example.

In the band elimination filter 3 according to the present preferred embodiment, the pitch of the electrode fingers f in the end portion e is preferably larger than the pitch of the electrode fingers f in the central portion c.

By setting the pitch of the electrode fingers f in the end portion e of the IDT electrode 101 to be larger than the pitch of the electrode fingers f in the central portion c of the IDT electrode 101 as described above, the wavelength λ2 specified in the end portion e of the IDT electrode 101 is longer than the wavelength λ1 specified in the central portion c. Thus, in the frequency characteristics of the parallel resonator 11, for example, the plurality of resonance points having the different resonant frequencies are obtained, that is, the resonance point specified by the pitch of the electrode fingers f in the central portion c and positioned on the higher frequency side and the resonance point specified by the pitch of the electrode fingers f in the end portion e and positioned on the lower frequency side. Thus, the band elimination filter 3 having a wider elimination band width ranging from the lower frequency side to the higher frequency side is able to be obtained by connecting the plurality of parallel resonators 11 to 14 in parallel.

While the present preferred embodiment has been described in connection with the example including the four parallel resonators 11 to 14, the number of parallel resonators is not limited to four. The band elimination filter 3 according to the present preferred embodiment may be defined in general terms as described below without limiting the number of parallel resonators.

Assuming that the plurality of parallel resonators are denoted by a k-th parallel resonator, a (k+1)-th parallel resonator, . . . , and an n-th parallel resonator (k and n are natural numbers satisfying 1≤k<n), having a higher resonant frequency first, a pitch of the electrode fingers f in the central portions c of the k-th parallel resonator is denoted by Ck, a pitch of the electrode fingers f in the end portion e of the k-th parallel resonator is denoted by Ek, and a pitch of the electrode fingers f in the central portion c of the (k+1)-th parallel resonator is denoted by C(k+1), the band elimination filter 3 according to the present preferred embodiment preferably satisfies Ek> C(k+1)> Ck.

In addition, assuming that a pitch of the electrode fingers f in the end portion e of the (k+1)-th parallel resonator is denoted by E(k+1), E(k+1)> Ek is preferably satisfied.

Under those conditions, bands ranging between the resonance points of the individual parallel resonators partially overlap each other. As a result, peaks and valleys in frequency characteristics of the parallel resonators partially cancel each other, such that level differences in impedance at an attenuation poles are reduced and the band elimination filter 3 having a wider elimination band width is obtained.

The band elimination filters 3 and the composite filter 1 according to the preferred embodiments of the present invention have been described above, but the present invention is not limited to the above-described preferred embodiments and modifications thereof. For example, other structures resulting from modifying, as described below, the above-described preferred embodiments and modifications thereof are also included in the present invention.

While, in the above preferred embodiments, the pair of comb-shaped electrodes 110a and 110b are bilaterally symmetric, by way of example, when viewed in plan, the arrangement of the comb-shaped electrodes is not limited to the bilaterally symmetric relationship, and they may be arranged to be bilaterally asymmetric. The bilaterally asymmetric arrangement may be obtained, for example, by arranging the electrode finger f in an outermost end portion of the comb-shaped electrode 110b on one side to be positioned on the outer side than the electrode finger f in an outermost end portion of the comb-shaped electrode 110a on the one side.

The structure of the band elimination filter 3 according to the above-described preferred embodiments is not limited to that illustrated in FIGS. 4A and 4B. In another example, the IDT electrode 101 may be defined by a single layer of a metal film instead of the multilayer structure of metal films. Moreover, the piezoelectric substrate 53 may have a multilayer structure including a high acoustic-velocity support substrate, a low acoustic-velocity film, and a piezoelectric film, which are laminated in the above-mentioned order. While, in the above-described preferred embodiments, the 45° Y cut X SAW propagation LiTaO$_3$ single crystal is preferably used, by way of example, as the piezoelectric substrate 53, materials of the single crystal are not limited to LiTaO$_3$, and cut angles of the single crystal material are also not limited to about 45°.

In the composite filter 1 according to the above-described preferred embodiments, an inductance element and/or a capacitance element may preferably be further connected between the input terminal 4 and the output terminal 5.

Preferred embodiments of the present invention may be widely used in communication devices, including a cellular phone, for example, as band elimination filters that each block passage of a signal in a predetermined frequency band, or as composite filters each including a band elimination filter according to a preferred embodiment of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A band elimination filter comprising:
a plurality of parallel resonators; wherein
each of the plurality of parallel resonators includes a piezoelectric substrate and an IDT electrode provided on a surface of the piezoelectric substrate;
the IDT electrode includes a pair of comb-shaped electrodes opposing each other;
the IDT electrode includes a plurality of electrode fingers, a pitch of the plurality of electrode fingers being different between an end portion of the IDT electrode in a propagation direction of an elastic wave and a central portion of the IDT electrode different from the end portion;

the plurality of parallel resonators include a first parallel resonator and a second parallel resonator having a higher resonant frequency than the first parallel resonator; and E1<C2<C1 is satisfied, where a pitch of the plurality of electrode fingers in the central portion of the first parallel resonator is denoted by C1, a pitch of the plurality of electrode fingers in the end portion of the first parallel resonator is denoted by E1, and a pitch of the plurality of electrode fingers in the central portion of the second parallel resonator is denoted by C2.

2. The band elimination filter according to claim 1, wherein, in each of the plurality of parallel resonators, the pitch of the plurality of electrode fingers in the end portion is smaller than the pitch of the plurality of electrode fingers in the central portion.

3. The band elimination filter according to claim 1, wherein E2<E1 is satisfied, where a pitch of the plurality of electrode fingers in the end portion of the second parallel resonator is denoted by E2.

4. A composite filter comprising:
a band pass filter; and
the band elimination filter according to claim 1; wherein
the band elimination filter is connected to the band pass filter.

5. The composite filter according to claim 4, wherein, in each of the plurality of parallel resonators, the pitch of the plurality of electrode fingers in the end portion is smaller than the pitch of the plurality of electrode fingers in the central portion.

6. The composite filter according to claim 4, wherein E2<E1 is satisfied, where a pitch of the plurality of electrode fingers in the end portion of the second parallel resonator is denoted by E2.

7. The composite filter according to claim 4, wherein Ek<C(k+1)<Ck is satisfied, where the plurality of parallel resonators are denoted by a k-th parallel resonator, a (k+1)-th parallel resonator, . . . , and an n-th parallel resonator, k and n are natural numbers satisfying 2 k<n, having lower resonant frequencies first, a pitch of the plurality of electrode fingers in the central portion of the k-th parallel resonator is denoted by Ck, a pitch of the plurality of electrode fingers in the end portion of the k-th parallel resonator is denoted by Ek, and a pitch of the plurality of electrode fingers in the central portion of the (k+1)-th parallel resonator is denoted by C(k+1).

8. The composite filter according to claim 7, wherein E(k+1)<Ek is satisfied, where a pitch of the plurality of electrode fingers in the end portion of the (k+1)-th parallel resonator is denoted by E(k+1).

9. A band elimination filter comprising:
a plurality of parallel resonators; wherein
each of the plurality of parallel resonators includes a piezoelectric substrate and an IDT electrode provided on a surface of the piezoelectric substrate;
the IDT electrode includes a pair of comb-shaped electrodes opposing each other;
the IDT electrode includes a plurality of electrode fingers, a pitch of the plurality of electrode fingers being different between an end portion of the IDT electrode in a propagation direction of an elastic wave and a central portion of the IDT electrode different from the end portion; and
Ek<C(k+1)<Ck is satisfied, where the plurality of parallel resonators are denoted by a k-th parallel resonator, a (k+1)-th parallel resonator, . . . , and an n-th parallel resonator, k and n are natural numbers satisfying 2 k<n, having lower resonant frequencies first, a pitch of the plurality of electrode fingers in the central portion of the k-th parallel resonator is denoted by Ck, a pitch of the plurality of electrode fingers in the end portion of the k-th parallel resonator is denoted by Ek, and a pitch of the plurality of electrode fingers in the central portion of the (k+1)-th parallel resonator is denoted by C(k+1).

10. The band elimination filter according to claim 9, wherein
E(k+1)<Ek is satisfied, where a pitch of the plurality of electrode fingers in the end portion of the (k+1)-th parallel resonator is denoted by E(k+1).

11. A composite filter comprising:
a band pass filter; and
the band elimination filter according to claim 9; wherein
the band elimination filter is connected to the band pass filter.

12. A band elimination filter comprising:
a plurality of parallel resonators; wherein
each of the plurality of parallel resonators includes a piezoelectric substrate and an IDT electrode provided on a surface of the piezoelectric substrate;
the IDT electrode includes a pair of comb-shaped electrodes opposing each other;
the IDT electrode includes a plurality of electrode fingers, a pitch of the plurality of electrode fingers being different between an end portion of the IDT electrode in a propagation direction of an elastic wave and a central portion of the IDT electrode different from the end portion; and
the plurality of parallel resonators include a first parallel resonator and a second parallel resonator having a lower resonant frequency than the first parallel resonator; and
E1>C2>C1 is satisfied, where a pitch of the plurality of electrode fingers in the central portion of the first parallel resonator is denoted by C1, a pitch of the plurality of electrode fingers in the end portion of the first parallel resonator is denoted by E1, and a pitch of the plurality of electrode fingers in the central portion of the second parallel resonator is denoted by C2.

13. The band elimination filter according to claim 12, wherein, in each of the plurality of parallel resonators, the pitch of the plurality of electrode fingers in the end portion is larger than the pitch of the electrode fingers in the central portion.

14. The band elimination filter according to claim 12, wherein E2>E1 is satisfied, wherein a pitch of the plurality of electrode fingers in the end portion of the second parallel resonator is denoted by E2.

15. A composite filter comprising:
a band pass filter; and
the band elimination filter according to claim 12; wherein
the band elimination filter is connected to the band pass filter.

16. The composite filter according to claim 15, wherein, in each of the plurality of parallel resonators, the pitch of the plurality of electrode fingers in the end portion is larger than the pitch of the electrode fingers in the central portion.

17. A band elimination filter comprising:
a plurality of parallel resonators; wherein
each of the plurality of parallel resonators includes a piezoelectric substrate and an IDT electrode provided on a surface of the piezoelectric substrate;
the IDT electrode includes a pair of comb-shaped electrodes opposing each other;

the IDT electrode includes a plurality of electrode fingers, a pitch of the plurality of electrode fingers being different between an end portion of the IDT electrode in a propagation direction of an elastic wave and a central portion of the IDT electrode different from the end portion; and $Ek > C(k+1) > Ck$ is satisfied, where the plurality of parallel resonators are denoted by a k-th parallel resonator, a (k+1)-th parallel resonator, . . . , and an n-th parallel resonator, k and n are natural numbers satisfying $2 k<n$, having a higher resonant frequency first, a pitch of the plurality of electrode fingers in the central portion of the k-th parallel resonator is denoted by Ck, a pitch of the plurality of electrode fingers in the end portion of the k-th parallel resonator is denoted by Ek, and a pitch of the plurality of electrode fingers in the central portion of the (k+1)-th parallel resonator is denoted by C(k+1).

18. The band elimination filter according to claim 17, wherein $E(k+1) > Ek$ is satisfied, where a pitch of the plurality of electrode fingers in the end portion of the (k+1)-th parallel resonator is denoted by E(k+1).

19. A composite filter comprising:

a band pass filter; and the band elimination filter according to claim 17; wherein the band elimination filter is connected to the band pass filter.

20. The composite filter according to claim 19, wherein the plurality of parallel resonators include a first parallel resonator and a second parallel resonator having a lower resonant frequency than the first parallel resonator; and $E1 > C2 > C1$ is satisfied, where a pitch of the plurality of electrode fingers in the central portion of the first parallel resonator is denoted by C1, a pitch of the plurality of electrode fingers in the end portion of the first parallel resonator is denoted by E1, and a pitch of the plurality of electrode fingers in the central portion of the second parallel resonator is denoted by C2.

21. The composite filter according to claim 20, wherein $E2 > E1$ is satisfied, wherein a pitch of the plurality of electrode fingers in the end portion of the second parallel resonator is denoted by E2.

* * * * *